(12) United States Patent
Usami et al.

(10) Patent No.: US 8,710,524 B2
(45) Date of Patent: Apr. 29, 2014

(54) LIGHT EMITTING ELEMENT, METHOD FOR MANUFACTURING THE LIGHT EMITTING ELEMENT, OPTICAL ELEMENT AND METHOD FOR MANUFACTURING THE OPTICAL ELEMENT

(75) Inventors: Yoshihisa Usami, Kanagawa (JP); Tadasuke Takahashi, Kanagawa (JP); Tetsuya Watanabe, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/529,984

(22) PCT Filed: Mar. 5, 2008

(86) PCT No.: PCT/JP2008/000450
§ 371 (c)(1),
(2), (4) Date: Dec. 23, 2009

(87) PCT Pub. No.: WO2008/123010
PCT Pub. Date: Oct. 16, 2008

(65) Prior Publication Data
US 2010/0090236 A1    Apr. 15, 2010

(30) Foreign Application Priority Data

Mar. 5, 2007 (JP) ................................ 2007-054289
Jul. 27, 2007 (JP) ................................ 2007-196756

(51) Int. Cl.
*H01L 33/00* (2010.01)

(52) U.S. Cl.
USPC .......... 257/98; 257/95; 257/E33.067; 438/29; 438/32

(58) Field of Classification Search
USPC ................... 257/95, 98, 99; 250/552; 362/84; 369/284
See application file for complete search history.

(56) References Cited

U.S. PATENT DOCUMENTS

| 4,013,465 A | 3/1977 | Clapham et al. |
|---|---|---|
| 6,791,117 B2 | 9/2004 | Yoshitake et al. |
| 6,900,473 B2 | 5/2005 | Yoshitake et al. |
| 2001/0033135 A1 | 10/2001 | Duggal et al. |
| 2003/0003261 A1* | 1/2003 | Saito et al. ............... 428/64.4 |
| 2005/0148105 A1 | 7/2005 | Suehiro et al. |
| 2006/0054904 A1 | 3/2006 | Lin et al. |
| 2006/0189013 A1 | 8/2006 | Schardt et al. |
| 2006/0202216 A1* | 9/2006 | Itonaga ........................ 257/94 |

FOREIGN PATENT DOCUMENTS

| JP | 2003-174191 | 6/2003 |
|---|---|---|
| JP | 2003-209283 | 7/2003 |
| WO | WO 2005/048361 | 5/2005 |

OTHER PUBLICATIONS

International Search Report—PCT/JP2008/000450—Jun. 17, 2009.
TW Office Action dated Aug. 16, 2013, with English translation; Application No. 097106630.
Supplementary European Search Report dated Feb. 13, 2014 in corresponding European Patent Application No. 08720336.0.

* cited by examiner

*Primary Examiner* — Colleen Matthews
*Assistant Examiner* — William Harriston
(74) *Attorney, Agent, or Firm* — Young & Thompson

(57) ABSTRACT

Fine asperities are simply formed in the surface of a light emission surface to improve an luminous efficiency of a light emitting element. An LED element 10 is prepared as an example of a luminous body, and a thermally deformable heat mode recording material layer 12 is formed in the light emission surface 18 of the LED element 10. The recording material layer 12 is then illuminated with condensed light so that a plurality of recessed portions 15 are formed at a pitch of 0.01-100 times a center wavelength of the light emitted from the LED element 10.

18 Claims, 7 Drawing Sheets

LIGHT EMITTING ELEMENT, METHOD FOR MANUFACTURING THE LIGHT EMITTING ELEMENT, OPTICAL ELEMENT AND METHOD FOR MANUFACTURING THE OPTICAL ELEMENT

TECHNICAL FIELD

The present invention relates to a light emitting element with improved luminous efficiency and a manufacturing method for this light emitting element. The present invention also relates to an optical element used for the light emitting element and a manufacturing method for this optical element.

BACKGROUND OF THE INVENTION

In a light emitting element such as an LED, a fluorescent lamp, an EL (electro-luminescence) element, and a plasma display, an outer sheath member of a luminous body is formed by a clear lens, a protecting film or a glass tube, and light is emitted to the outside (into the air) through the surface of the outer sheath member.

In general, a refractive index of this transparent outer sheath member is much greater than the refractive index of air. Therefore, when the light is emitted to the outside from the outer sheath member, reflection occurs at a boundary between the outer sheath member and the air. In some cases, according to an angle of reflection of the light, the light reflected at the boundary is not emitted from the inside to the outside of the outer sheath member, and the light is converted into heat in the end.

Further, a light emitting element such as an LED has a substrate, on which a semiconductor multilayer film including a light emitting layer is laminated to provide a semiconductor element, and the semiconductor element is packaged with resin, etc. However, since the refractive index is different between the upper-most layer of a light outlet port of the semiconductor element and the resin of the package, reflection occurs at their boundary.

When looking at the light emitting element from outside, the reflection of the light at the boundary will result in a deterioration in the luminous efficiency. Further, since the temperature of the light emitting element increases, the life duration of the light emitting element will be disadvantageously shortened. A device incorporating this light emitting element may disadvantageously suffer from adverse effects due to elevated temperature of the light emitting element.

As a counter-measure for preventing a decrease in the luminous efficiency due to the reflection at the boundary, for example, Patent Documents 1 and 2 disclose methods of providing a fine asperity structure on the boundary surface.

Patent Document 1: Japanese Laid-open Patent Publication No. 2003-174191

Patent Document 2: Japanese Laid-open Patent Publication No. 2003-209283

DISCLOSURE OF THE INVENTION

Problems to be Solved by the Invention

According to the fifth embodiment of Patent Document 1, a method of forming fine asperities is disclosed, in which an antireflection film is provided as the upper-most layer constituting the light outlet port of the semiconductor element, and in order to form fine asperities on the surface of the antireflection film, a mold having a fine asperity pattern is prepared in advance. The surface of the antireflection film is press formed using this mold to form asperities on the surface of the light outlet port. As a modified embodiment, instead of the press forming using the mold, there is disclosed a method of roughening the surface of the antireflection film in random directions using a grinder. However, the former method disadvantageously requires a complicated process for preparing the mold, and the preparation of the mold entails its cost. In the latter method, it is difficult to constantly provide a uniform rough surface, which disadvantageously leads to variation in product performance.

On the other hand, Patent Document 2 discloses a method of forming asperities (unevenness) on a semiconductor element. The method comprises the steps of forming a line-and-space pattern having a triangular cross section by using a blade apparatus on a current diffusion layer which constitutes the upper-most layer of a light outlet port of the semiconductor element, and forming the asperities of sub-micron order on the surface of the current diffusion layer with a high-temperature hydrochloric acid treatment. Alternatively, the method may comprise the steps of forming a line-and-space pattern on a current diffusion layer using a photoresist, and forming fine asperities similar to those prepared by the above method on the surface of the current diffusion layer by a reactive ion etching (RIE) method. However, these methods also disadvantageously require complicated processes.

In view of the above background, it is an object of the present invention to simply form fine asperities on a surface of an outer sheath member which is in contact with air or on a surface of the upper-most layer of a light outlet port of a semiconductor element (hereinafter these surfaces are referred to as a light emission surface), so that the luminous efficiency of this light emitting element can be improved.

Means for Solving the Problems

According to one aspect of the present invention, there is provided a light emitting element comprising: a luminous body; and a thermally deformable heat mode recording material layer provided over a light emission surface; wherein a plurality of recessed portions are formed in the recording material layer at a pitch of 0.01-100 times a center wavelength of light emitted from the luminous body.

According to another aspect of the present invention, there is provided a method of manufacturing a light emitting element with a luminous body comprising the steps of: forming a thermally deformable heat mode recording material layer over a light emission surface; and illuminating the recording material layer with converged light to form a plurality of recessed portions in the recording material layer at a pitch of 0.01-100 times a center wavelength of light emitted from the luminous body.

According to still another aspect of the present invention, there is provided an optical element to be mounted over a light emission surface of a light emitting element so as to improve a luminous efficiency of the light emitting element, the optical element comprising: a supporting member which allows light emitted from the light emitting element to transmit therethrough; and a thermally deformable heat mode recording material layer provided over a surface of the supporting member, wherein a plurality of recessed portions are formed in the recording material layer at a pitch of 0.01-100 times a center wavelength of light emitted from the light emitting element.

According to another aspect of the present invention, there is provided a method of manufacturing an optical element which is to be mounted over a light emission surface of a light emitting element so as to improve a luminous efficiency of the light emitting element. The method comprises the steps of:

forming a thermally deformable heat mode recording material layer over a surface of a supporting member which allows light emitted from the light emitting element to transmit therethrough; and illuminating the recording material layer with converged light to form a plurality of recessed portions in the recording material layer at a pitch of 0.01-100 times a center wavelength of light emitted from the light emitting element.

According to these aspects of the present invention as described above, it is possible to improve the transmissivity of the light emitted from the light emission surface by simple steps comprising forming the recording material layer, and illuminating the recording material layer with the converged light. In other words, the luminous efficiency of the light emitting element can be improved.

Further, illumination of the recording material layer with the converged light may be performed using a conventional well-known focusing technique. Therefore, it is easy to deal with warpage or bent of a semiconductor element, leading to improved mass productivity.

In the aforementioned manufacturing method for a light emitting element and manufacturing method for an optical element, etching may be performed with the recording material layer as a mask to form a plurality of holes in the light emission surface or the surface of the supporting member corresponding to the recessed portions.

According to these manufacturing methods, since asperities are formed on the surface itself of the light emitting element or the optical element, as compared with a configuration in which asperities are formed on the recording material layer, it is possible to simply design the asperity pattern without consideration of the refractive index difference between the light emitting element, etc. and the recording material layer. According to the present invention, a plurality of recessed portions are formed in the recording material layer, which has been formed in advance on the surface of the light emitting element, etc., using, for example, the focusing technique, so that a mask is set in close contact with the surface of the light emitting element, etc. The present invention is free from a conventional drawback that because of warpage or bent of the surface of the light emitting element, etc., a mask does not closely contact with the surface of the light emitting element, etc. Therefore, the asperity pattern can be formed in a simple manner.

MODES FOR CARRYING OUT THE INVENTION

First Embodiment

With reference to the drawings, a light emitting element and a manufacturing method for the light emitting element according to the present invention will be described.

Figure 1A:
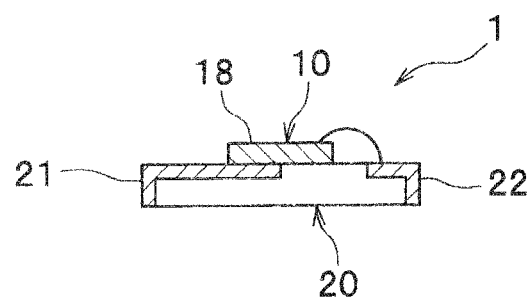
FIG. 1A is a diagram of an LED package.

As shown in FIG. 1A, an LED package 1 as an example of a light emitting element according to this embodiment comprises an LED element 10 as an example of a luminous body, and a case 20 for fixing and wiring the LED element 10.

The LED element 10 is a conventionally known element. Although not shown in detail in the drawings, the LED element 10 includes an n-type cladding layer, a p-type cladding layer, and an active layer. In FIG. 1A, an upper surface is a light emission surface 18, from which light is emitted to the outside.

The LED element 10 is fixed to the case 20. The case 20 is provided with wiring 21, 22 for supplying electric power to the LED element 10.

Figure 1B:
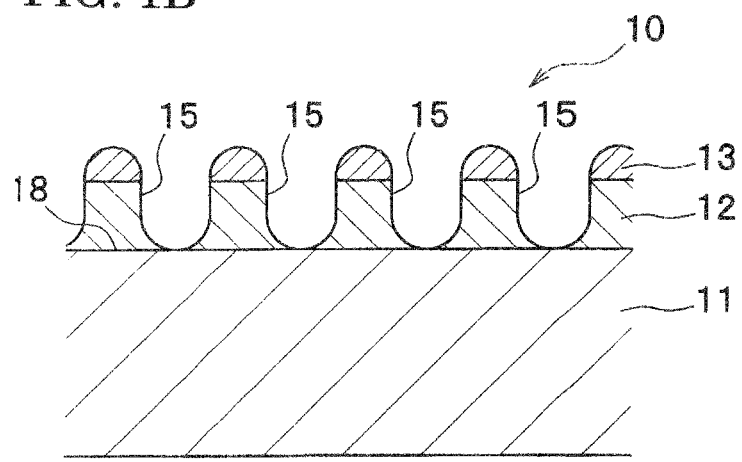
FIG. 1B is an enlarged view of FIG. 1A.

As seen in FIG. 1B, the LED element 10 includes a light emitting portion 11 which is a main body portion for emitting light, a recording material layer 12 formed on the light emitting portion 11 (on a light emission surface 18), and a barrier layer 13 in this order.

The recording material layer 12 is a layer made of a so-called thermally deformable heat mode recording material layer. When the recording material layer 12 is illuminated with a strong light beam, the light is converted into heat and this heat causes the material to change its shape so as to form a recessed portion in the surface thereof. This type of recording material is generally and conventionally used for a recording layer of an optical recording disc or the like. Examples of this recording material may include cyanine-based, phthalocyanine-based, quinone-based, squarylium-based, azlenium-based, thiol complex salt-based, and melocyanine-based recording materials.

The recording material layer 12 according to the present invention preferably contains a dye as a recording substance.

Therefore, the recording substance contained in the recording material layer 12 is an organic compound such as dye. However, the material for the recording material layer 12 is not limited to an organic material; an inorganic material or a composite material including an inorganic material and an organic material may also be employed. In the case of the organic material, however, formation of a film is readily performed by spin coating, and it is easy to obtain a material with lower transition temperatures. Therefore, it is preferable that an organic material is used as the recording material. Further, among various organic materials, it is preferable to use a dye whose light absorption can be controlled by designing the molecules of the organic material.

Preferred examples of the recording material layer 12 may include methine dyes (cyanine dyes, hemicyanine dyes, styryl dyes, oxonol dyes, melocyanine dyes, etc.), large ring dyes (phthalocyanine dyes, naphthalocyanine dyes, porphyrin dyes, etc.), azo dyes (including an azo chelating dye containing a metal ion), arylidene dyes, complex dyes, coumarin dyes, azole derivatives, triazine derivatives, 1-aminobutadiene derivatives, cinnamic acid derivatives, quinophthalone dyes.

Of these, a write-once dye-containing recording material layer 12 is preferable, in which information can be recorded with a laser beam. This is because such an organic recording material can be dissolved in a solvent and formed into a film by spin coating method or spray coating method, and therefore, excels in productivity. It is preferable that this dye-containing recording material layer 12 contains dye having absorption characteristics in the recording wavelength region. Particularly, the upper limit of an extinction coefficient k indicating the amount of light absorption is preferably 10 or less, more preferably 5 or less, further more preferably 3 or less, and most preferably 1 or less. If the extinction coefficient k is too high, incoming light from one side of the recording material layer 12 does not reach or pass through the opposite side, so that uneven holes are formed in the recording material layer 12. Meanwhile, the lower limit of the extinction coefficient k is preferably 0.0001 or more, more preferably 0.001 or more, and most preferably 0.1 or more. If the extinction coefficient k is too low, the amount of light absorption becomes smaller and accordingly higher laser power is required. This results in decreased production speed.

As described above, it is necessary that the recording material layer 12 has light absorption characteristics in the recording wavelength region. In this regard, it is possible to select an appropriate dye or to alter the structure of the dye used, in accordance with the wavelength of the laser light emitted from the laser beam source.

For example, in the case where the oscillation wavelength of the laser beam from the laser beam source is around 780 nm, it is advantageous to select dyes such as pentamechine cyanine dyes, heptamechine oxonol dyes, pentamethine oxonol dyes, phthalocyanine dyes, and naphthalocyanine dyes.

In the case where the oscillation wavelength of the laser beam from the laser beam source is around 660 nm, it is advantageous to select dyes such as trimechine cyanine dyes, pentamethine oxonol dyes, azo dyes, azo metal complex dyes, and pyrromethene complex dyes.

Further, in the case where the oscillation wavelength of the laser beam from the laser beam source is around 405 nm, it is advantageous to select dyes such as monomechine cyanine dyes, monomechine oxonol dyes, zero-mechine melocyanine dyes, phthalocyanine dyes, azo dyes, azo metal complex dyes, porphyrin dyes, arylidene dyes, complex dyes, coumarin dyes, azole derivatives, triazine derivatives, benzotriazole derivatives, 1-aminobutadiene derivatives, and quinophthalone dyes.

Preferred compounds for use in the recording material layer 12 (i.e., as a recording layer compound) are shown below in the cases where the oscillation wavelength of the laser beam is around 780 nm, 660 nm, and 405 nm, respectively. In the following chemical formulae, compounds given by formulae (I-1) to (I-10) are suitable in the case where the oscillation wavelength of the laser beam is around 780 nm. Compounds given by formulae (II-1) to (II-8) are suitable in the case where the oscillation wavelength of the laser beam is around 660 nm, and compounds given by formulae (III-1) to (III-14) are suitable in the case where the oscillation wavelength of the laser beam is around 405 nm. The present invention is not limited to the case where these compounds are used as the recording layer compound.

Examples of recording layer compound in the case of oscillation wavelength around 780 nm

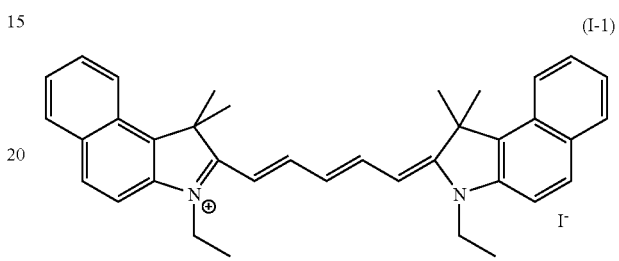

(I-1)

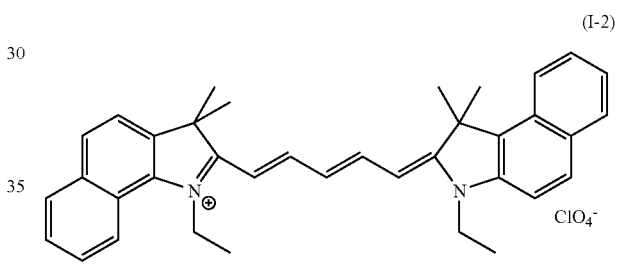

(I-2)

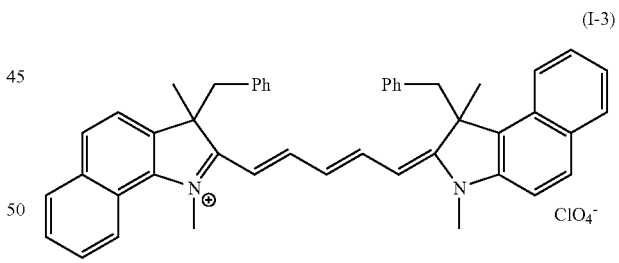

(I-3)

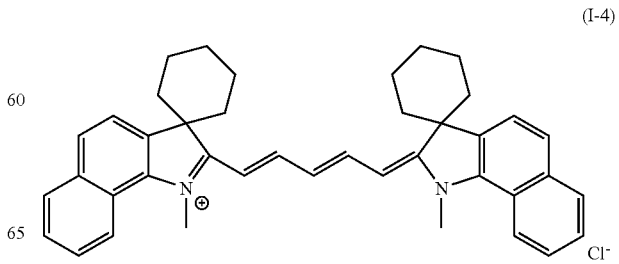

(I-4)

-continued
(I-5)
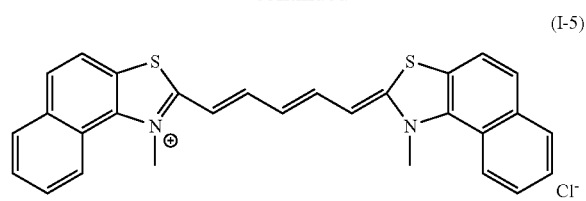
(I-6)
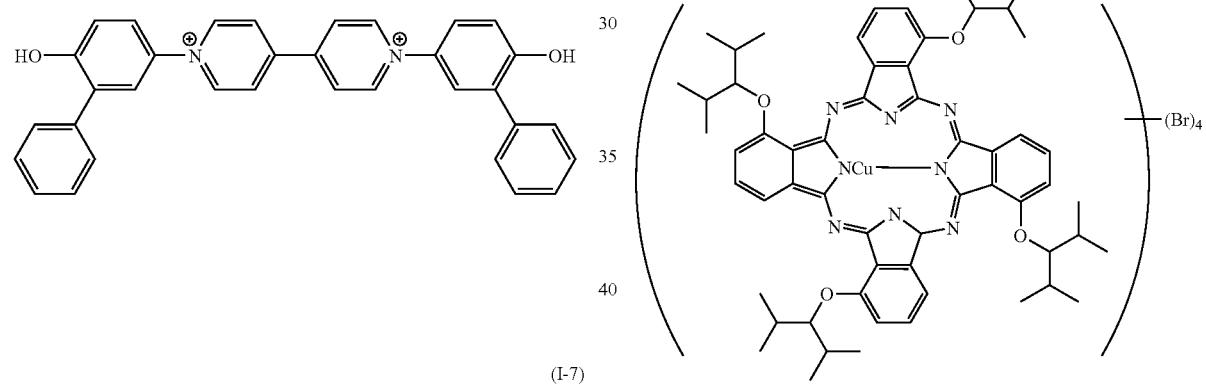
(I-8)
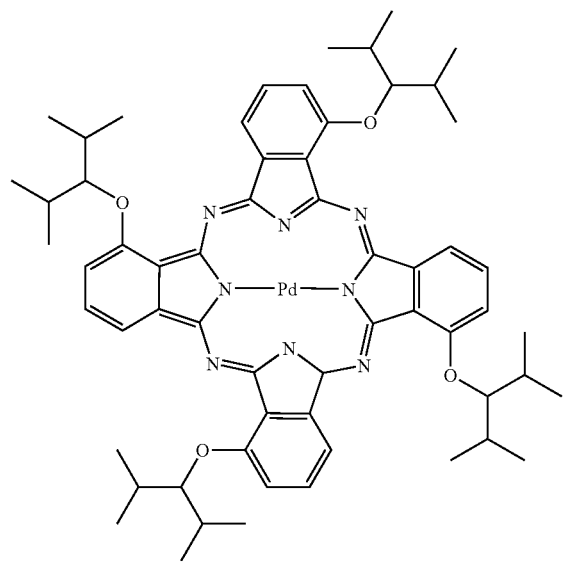
(I-9)
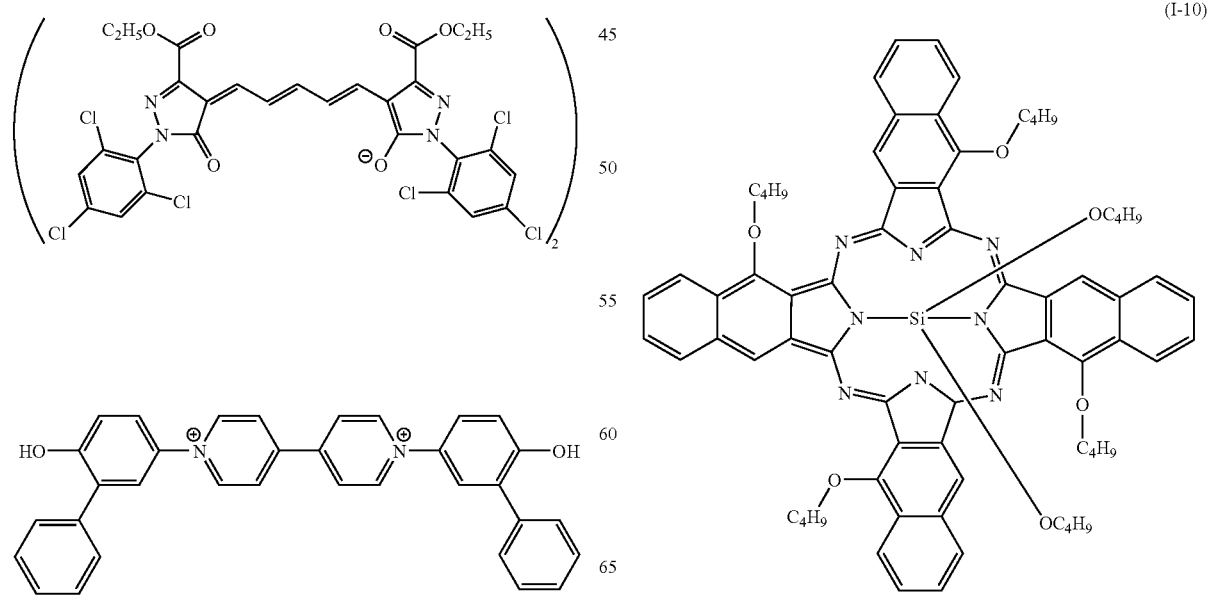
(I-7)
(I-10)

Examples of recording layer compound in the case of oscillation wavelength around 660 nm
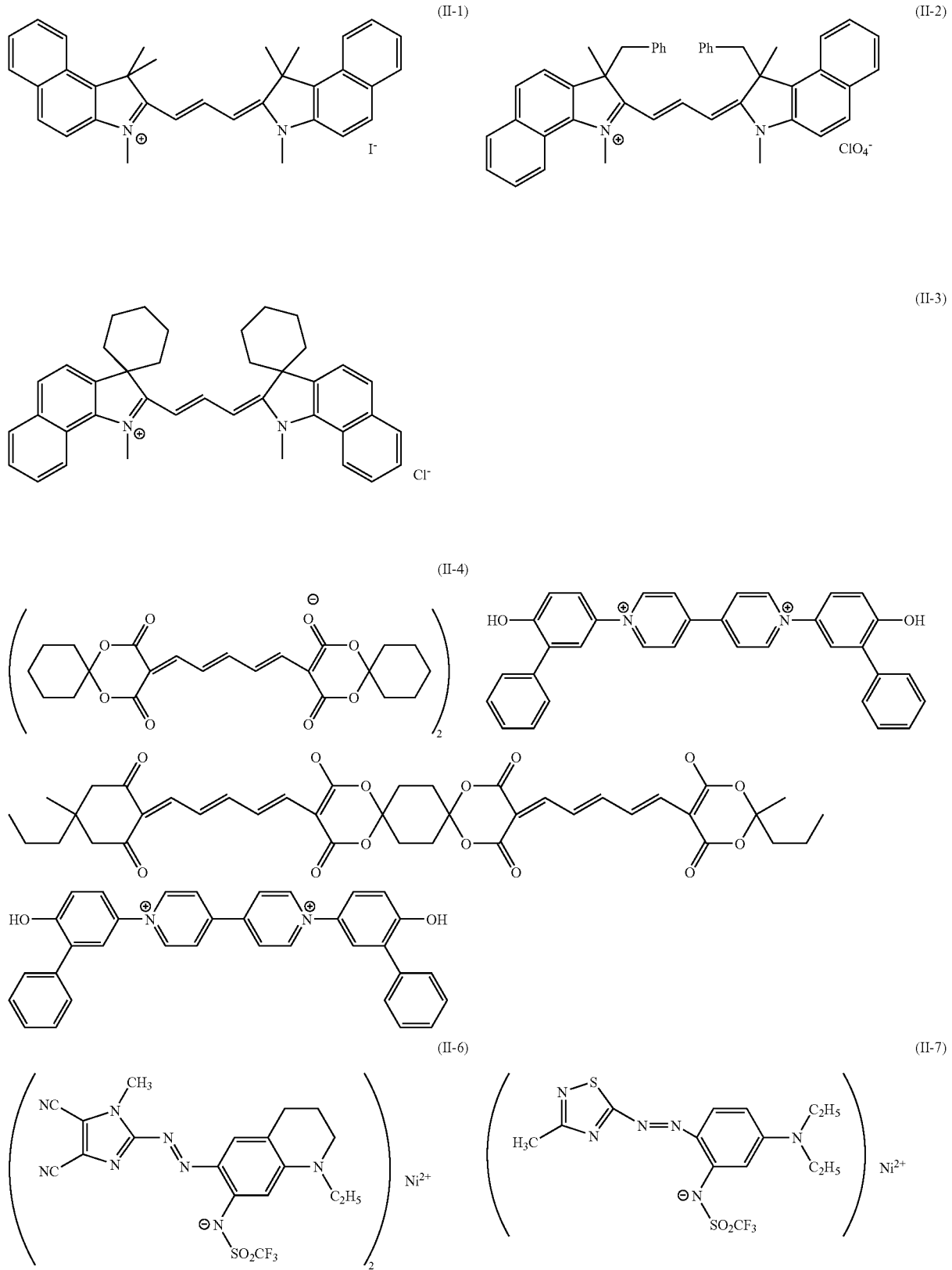

-continued
(II-8)
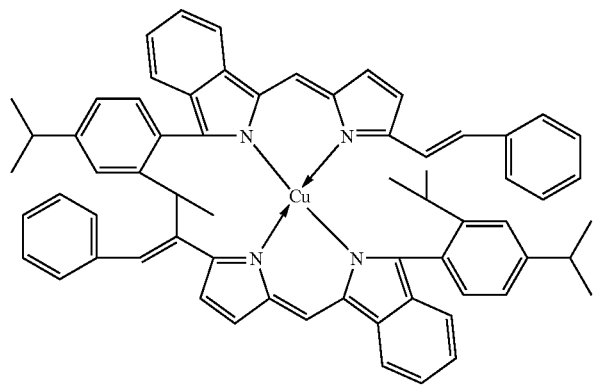
Examples of recording layer compound in the case of oscillation wavelength around 405 nm
(III-1)
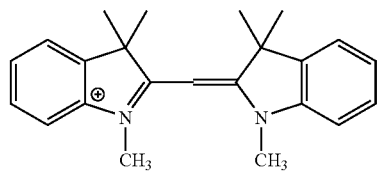
-continued
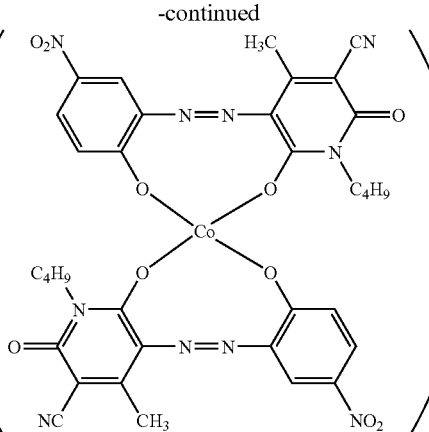
(III-3)
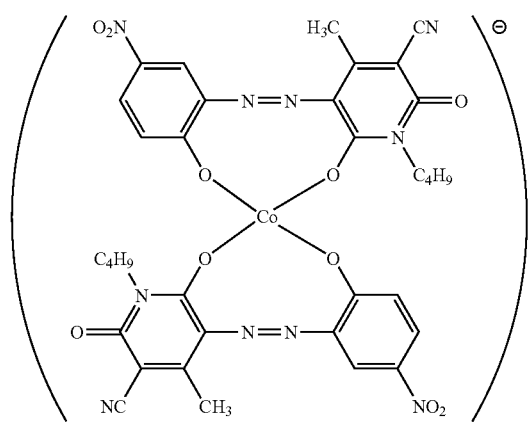
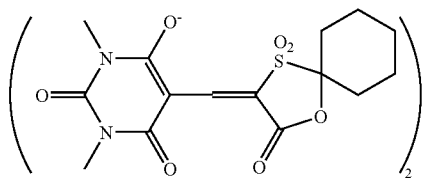
(III-4)
(III-2)
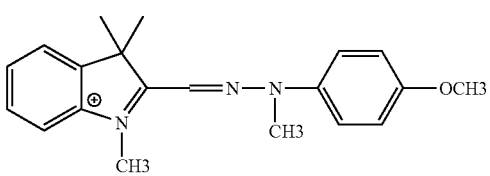
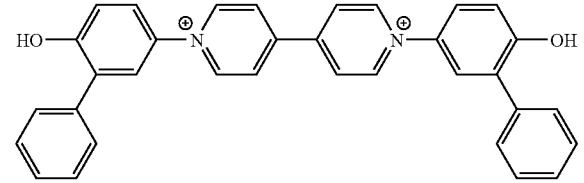

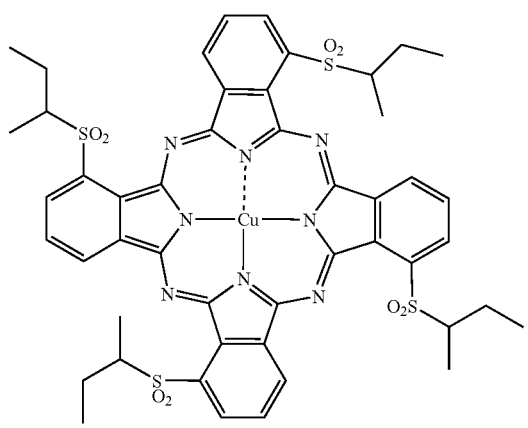
(III-5)

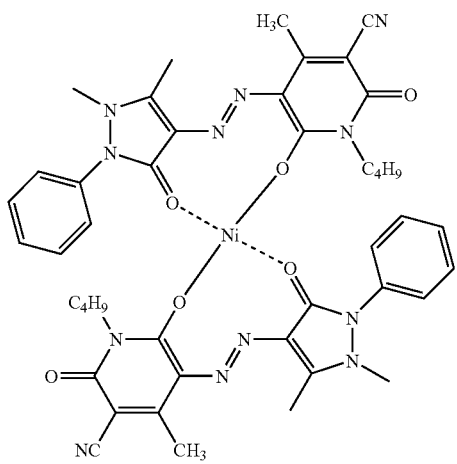
(III-6)

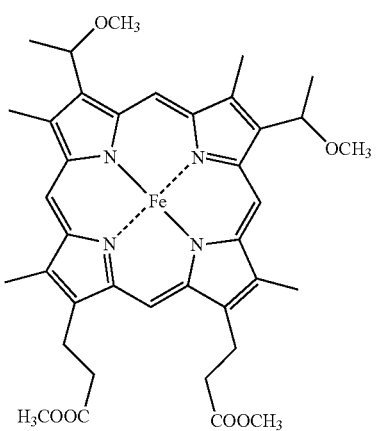
(III-7)

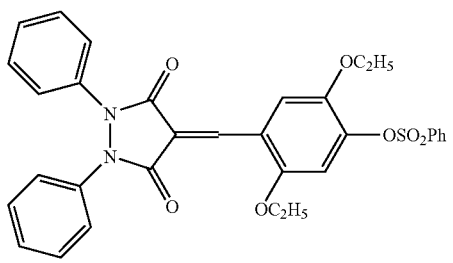
(III-8)

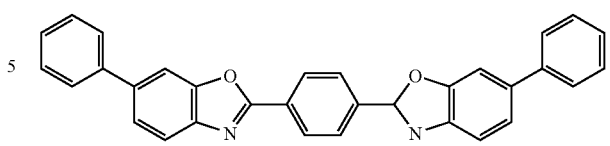
(III-9)

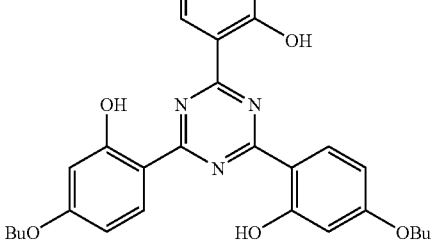
(III-10)

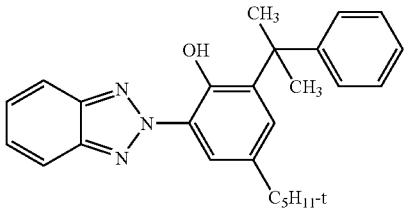
(III-11)

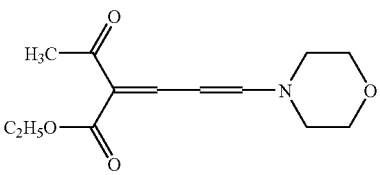
(III-12)

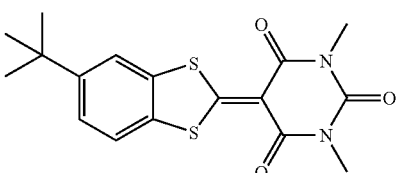
(III-13)

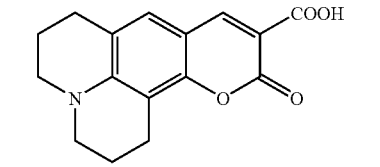
(III-14)

Dyes described in Japanese Laid-open Patent Publication Nos. 4-74690, 8-127174, 11-53758, 11-334204, 11-334205, 11-334206, 11-334207, 2000-43423, 2000-108513, and 2000-158818 can also preferably be used.

The dye-containing recording material layer 12 is formed in such a manner that a coating liquid is prepared by dissolving dye in an adequate solvent along with a binding agent, applying the coating liquid on a substrate or a light reflection layer to be described later to form a coating film, and thereafter drying the coating film. In this instance, a temperature of a surface on which the coating liquid is applied is preferably in the range of 10-40 degrees centigrade. More preferably, the lower limit thereof is 15 degrees centigrade or higher, further more preferably 20 degrees centigrade or higher, and most preferably 23 degrees centigrade or higher. Meanwhile, the upper limit of the surface is more preferably 35 degrees centigrade or lower, further more preferably 30 degrees centigrade or lower, and most preferably 27 degrees centigrade or lower. When the temperature of the coated surface is in the above ranges, uneven application of the coating and coating failure can be prevented and a thickness of the coating film can be made uniform.

Each of the upper and lower limits mentioned above can be arbitrarily combined to each other.

Here, the recording material layer 12 may be either mono-layered or multi-layered. In the case of the recording material layer 12 having a multi-layered configuration, the coating step is repeated plural times.

A concentration of the dye in the coating liquid is generally in the range of 0.01-15 mass percent, preferably in the range of 0.1-10 mass percent, more preferably in the range of 0.5-5 mass percent, and most preferably in the range of 0.5-3 mass percent.

Examples of the solvent for the coating liquid include: esters such as butyl acetate, ethyl lactate and cellosolve acetate; ketones such as methyl ethyl ketone, cyclohexanone, and methyl isobutyl ketone; chlorinated hydrocarbons such as dichloromethane, 1,2-dichloroethane and chloroform; amides such as dimethylformamide; hydrocarbons such as methylcyclohexane; ethers such as tetrahydrofuran, ethyl ether, and dioxane; alcohols such as ethanol, n-propanol, isopropanol, n-butanol, and diacetone alcohol; fluorinated solvents such as 2,2,3,3-tetrafluoropropanol; and glycol ethers such as ethylene glycol monomethyl ether, ethylene glycol monoethyl ether and propylene glycol monomethyl ether.

Taking the solubility of the dye used in the solvents into consideration, the above solvents may be used singularly or in a combination of two or more kinds thereof. Various kinds of the additives such as an antioxidant, a UV absorbent, a plasticizer and a lubricant can be added in the coating liquid in accordance with the purpose.

Coating methods such as spray method, spin coating method, dip method, roll coat method, blade coat method, doctor roll method, doctor blade method, and screen printing method are applicable. Of these methods, the spin coat method is preferable in terms of its excellent productivity and easy controlling of the film thickness.

In order to form the recording material layer 12 (recording layer compound) by the spin coat method, it is preferable that the dye is dissolved in the organic solvent in the range of 0.3-30 weight percent, and more preferably in the range of 1-20 weight percent. It is particularly preferable that the dye is dissolved in tetrafluoropropanol in the range of 1-20 weight percent. It is also preferable that the decomposition temperature of the recording layer compound is in the range of 150-500 degrees centigrade, and more preferably in the range of 200-400 degrees centigrade.

At the time of coating, a temperature of the coating liquid is preferably in the range of 23-50 degrees centigrade, more preferably in the range of 24-40 degrees centigrade, and most preferably in the range of 25-30 degrees centigrade.

In the case where the coating liquid contains a binding agent, examples of the binding agent include natural organic polymers such as gelatin, cellulose derivatives, dextran, rosin and rubber; and synthetic organic polymers including hydrocarbonic resins such as polyethylene, polypropylene, polystylene and polyisobutylene, vinyl resins such as polyvinylchloride, polyvinylidene chloride and polyvinylchloride-polyvinyl acetate copolymers, acrylic resins such as polymethyl acrylate and polymethyl methacrylate, and initial condensates of thermosetting resins such as polyvinyl alcohol, chlorinated polyethylene, epoxy resin, butyral resin, rubber derivatives and phenol formaldehyde resin. In the case where the binding agent is used together as a material for the recording material layer 12, the amount of the binding agent used is generally in the range of 0.01-50 times the amount of dye (mass ratio), and preferably in the range of 0.1-5 times the amount of dye (mass ratio).

In order to increase the light resistance of the recording material layer 12, various antifading agents can be contained in the recording material layer 12.

In general, a singlet oxygen quencher is used for the antifading agent. As examples of such singlet oxygen quencher, those described in published documents such as already known patent specifications can be used.

Specific examples of these patent specifications are Japanese Laid-open Patent Publication (JP-A) Nos. 58-175693, 59-81194, 60-18387, 60-19586, 60-19587, 60-35054, 60-36190, 60-36191, 60-44554, 60-44555, 60-44389, 60-44390, 60-54892, 60-47069, 63-209995, and 4-25492; Japanese Patent Publication (JP-B) Nos. 1-38680 and 6-26028; German Patent No. 350399; and Nippon Kagaku Kaishi, October (1992), p. 1141.

The use amount of the antifading agent such as a singlet oxygen quencher relative to the amount of dye is generally in the range of 0.1-50 mass percent, preferably in the range of 0.5-45 mass percent, more preferably in the range of 3-40 mass percent, and most preferably in the range of 5-25 mass percent.

Although the coating method for the solvent has been described above in the case where the recording material layer 12 is a dye-containing recording layer, the recording material layer 12 may be formed by a film-formation method such as deposition, sputtering, and CVD, in accordance with physical properties of the recording substance.

The dye used in the recording material layer 12 is selected such that an optical absorptance thereof becomes the highest among the wavelengths of the laser beam for processing recessed portions 15 to be described later. In particular, it is preferable that the optical absorptance is higher at the wavelength of the laser beam during the processing than the emission wavelength of the light emitting element such as the LED element 10.

The absorption peak wavelength of the dye is not necessary to be within the range of the wavelength of visible light. The dye may have the absorption peak wavelength at an ultraviolet region or at an infrared-red region.

Particularly, when the refractive index of the material constituting the light emission surface of the light emitting element is high, it is preferable that the recording material layer 12 and the barrier layer 13, which constitute the recessed portions 15, have higher optical absorptance.

Dye has a wavelength region with higher optical absorptance at a long-wavelength side of the absorption peak wavelength. It is preferable to conform this wavelength region to the emission wavelength of the light emitting element. For this reason, a dye-absorption wavelength $\lambda a$ is preferably shorter than the center wavelength $\lambda c$ of the light emitting element ($\lambda a < \lambda c$). The difference between $\lambda a$ and $\lambda c$ is preferably 10 nm or more, more preferably 25 nm or more, and most preferably 50 nm or more. If $\lambda a$ and $\lambda c$ are too approximate, an absorption wavelength region of the dye overlaps the center wavelength $\lambda c$ of the light emitting element, so that light is absorbed. Further, the upper limit of the difference between $\lambda a$ and $\lambda c$ is preferably 500 nm or less, more preferably 300 nm or less, and most preferably 200 nm or less. If the λa and λc are too different, the refractive index becomes smaller for the light emitted from the light emitting element.

When the recessed portions 15 are formed with the laser beam, it is preferable that the wavelength λw of the laser beam satisfies the relation of λa<λw. If this relation is satisfied, the amount of light absorption of the dye is appropriate and the recording efficiency is improved, and further a fine asperity pattern can be formed. Further, it is preferable that the relation of λw<λc is satisfied. Since λw should be a wavelength which is absorbed by the dye, if the center wavelength λc of the light emitting element exists at a long-wavelength side than at the wavelength λw of the laser beam, the light emitted from the light emitting element is not absorbed by the dye. This can improve the transmissivity, and as the result, the luminous efficiency is improved.

In view of the above, it is most preferable that the relation of λa<λw<λc is satisfied.

The wavelength λw of the laser beam used for forming the recessed portions 15 may be any wavelength as long as a sufficiently high laser power is obtained. In the case where a dye is used for the recording material layer 12, it is preferable that the wavelength is 1000 nm or less, including, for example, 193 nm, 210 nm, 266 nm, 365 nm, 405 nm, 488 nm, 532 nm, 633 nm, 650 nm, 680 nm, 780 nm, and 830 nm.

The kind of the laser beam used may be any known laser beam including gas laser, solid laser, and semiconductor laser. However, in order to simplify the optical system, use of the solid laser or the semiconductor laser is preferable. The laser beam may be a continuous light beam or pulsed light beam. However, it is preferable to use a laser beam capable of changing its emission intervals. For example, use of a semiconductor laser is preferable. In the case where the laser beam is not directly on-off keyed, it is preferable that the laser beam is modulated using an external modulation element.

In order to increase the processing speed, a higher laser power is preferable. However, the higher the laser power, the higher scanning speed (speed for scanning the recording material layer 12 with the laser beam; for example, rotation speed of the optical disc drive to be described later) is required.

For this reason, taking the upper limit value of the scanning speed into consideration, the upper limit value of the laser power is preferably 100 W, more preferably 10 W, and further more preferably 5 W, and most preferably 1 W. Meanwhile, the lower limit value of the laser power is preferably 0.1 mW, more preferably 0.5 mW, and most preferably 1 mW.

It is preferable that the laser beam has a narrow range of oscillation wavelength and excels in coherency, and that the laser beam is condensed to a spot size which is as small as the wavelength of the laser beam. Further, it is preferable that the strategy used for optical discs is employed as a recording strategy (i.e., optical pulse illumination conditions for appropriately forming recessed portions 15). To be more specific, conditions required for the manufacture of optical discs, such as recording speed, peak value of the illuminating laser beam, and pulse width, are preferably used.

It is preferable that the thickness of the recording material layer 12 is determined in accordance with the depth of the recessed portion 15 to be described later. This thickness is appropriately set, for example, in the range of 1-10000 nm. The lower limit of the thickness is preferably 10 nm or more, and more preferably 30 nm or more. If this thickness is too thin, a recessed portion 15 formed is so shallow that optical effects are not obtained. Further, in the case where the recording material layer 12 is used as an etching mask as described later, it is difficult to obtain etching effects. Meanwhile, the upper limit of the thickness is preferably 1000 nm or less, and more preferably 500 nm or less. If this thickness is too thick, an extremely high laser power is required and it becomes difficult to form a deep hole, which leads to decreased processing speed.

Further, it is preferable that the thickness t of the recording material layer 12 and the diameter d of the recessed portion 15 has the following relation. Namely, the upper limit value of the thickness t of the recording material layer 12 preferably takes a value to satisfy the relation of t<10d, more preferably takes a value to satisfy t<5d, and most preferably to satisfy t<3d. The lower limit value of the thickness of the recording material layer 12 preferably takes a value to satisfy the relation of t>d/100, more preferably takes a value to satisfy t>d/10, and most preferably to satisfy t>d/5. The reason for determining the upper limit value and the lower limit value of the thickness t of the recording material layer 12 in accordance with the diameter d of the recessed portion 15 is the same as those described above.

To form the recording material layer 12, a substance which will act as a recording material is dissolved or dispersed in an appropriate solvent to prepare a coating liquid. Thereafter, the coating liquid is coated on the surface of the light emission surface 18 by a coating method such as spin coating, dip coating, and extrusion coating, so that the recording material layer 12 can be formed.

The barrier layer 13 is formed to protect the recording material layer 12 from an impact shock, etc. The barrier layer 13 is optionally provided. Any conventional material may be used to form the barrier layer 13 as long as it is a transparent material. Preferably, the barrier layer 13 is made of polycarbonate, cellulose triacetate, etc., and more preferably, the barrier layer 13 is made of a material whose moisture absorptivity is 5% or less at 23° C.50% RH. Oxides and sulfides such as $SiO_2$, ZnS, and GaO may also be used.

The term "transparent" means that the material allows light emitted from the LED element 10 to transmit therethrough (transmissivity: 90% or more).

The barrier layer 13 is formed as follows. Firstly, light curing resin which forms an adhesive layer is dissolved in an appropriate solvent to prepare a coating liquid. This coating liquid is then coated on the recording material layer 12 at a predetermined temperature to form a coating film, and a cellulose triacetate film (TAC film) obtained, for example, by plastic extrusion processing is laminated on the coating film. Finally, the laminated TAC film is illuminated with light so that the coating film is cured to provide the barrier layer 13. It is preferable that the TAC film contains an ultraviolet light absorber. The thickness of the barrier layer 13 is in the range of 0.01-0.2 mm, preferably in the range of 0.03-0.1 mm, and more preferably in the range of 0.05-0.095 mm.

A plurality of recessed portions 15 are intermittently formed in the recording material layer 12 and the barrier layer 13. The recessed portion 15 is formed when the recording material layer 12 and the barrier layer 13 are illuminated with a condensed light beam and the shapes of the illuminated parts are changed (including a change of shape by extinction). It is preferable that the recessed portions 15 are closely formed in an area where the light beam is emitted from the light emission surface 18.

The principle for forming the recessed portions 15 will be explained below.

When the recording material layer 12 (recording layer compound) is illuminated with a laser beam having a wavelength within a light absorption wavelength region of the material (i.e., a wavelength of light absorbed by the material), the laser beam is absorbed by the recording material layer 12.

The absorbed laser beam is then converted into heat to thereby increase the temperature at an illuminated area of the recording material layer 12. This causes the recording material layer 12 to undergo chemical change or/and physical change such as softening, liquefaction, vaporization, sublimation, and decomposition. When the chemically- or/and physically-changed material moves or disappears, recessed portions 15 are formed in the recording material layer 12. Since the barrier layer 13 is a very thin layer, the barrier layer 13 moves or/and disappears together with the recording material layer 12 upon movement or/and disappearance of the recording material layer 12.

As a method for forming a plurality of recessed portions 15, a conventional method for forming a plurality of pits in a write-once optical disc is applicable. To be more specific, a known Running OPC (Optimum Power Control) method such as disclosed in Japanese Patent No. 3096239 can be used. In the Running OPC method, for example, a reflected light intensity of the laser beam that is changed in accordance with the pit size is detected, and the output of the laser is adjusted such that the reflected light intensity becomes constant, so that uniform sized pits are formed in a recording region.

It is preferable that vaporization, sublimation or decomposition of the above recording material layer 12 (recording layer compound) has a high rate of change which is precipitous. To be more specific, the weight decreasing rate obtained by a thermo gravimetry differential thermal analyzer (TG-DTA) during vaporization, sublimation or decomposition of the recording layer compound is preferably 5% or more, more preferably 10% or more, and most preferably 20% or more. Further, the slope of weight decrease (weight decreasing rate per elevated temperature of 1° C.) obtained by the thermo gravimetry differential thermal analyzer (TG-DTA) during vaporization, sublimation or decomposition of the recording layer compound is preferably 0.1%/° C. or more, more preferably 0.2%/° C. or more, and most preferably 0.4%/° C.

The upper limit value of the transition temperature of the chemical change or/and the physical change such as softening, liquefaction, vaporization, sublimation, and decomposition is preferably 2000° C. or less, more preferably 1000° C. or less, and most preferably 500° C. or less. This is because if the transition temperature is too high, a higher laser power is required.

The lower limit, value of the transition temperature is preferably 50° C. or more, more preferably 100° C. or more, and most preferably 150° C. or more. This is because if the transition temperature is too low, the temperature gradient from the environment is small so that the shape of an edge of a hole is not formed clearly.

Figure 2A:
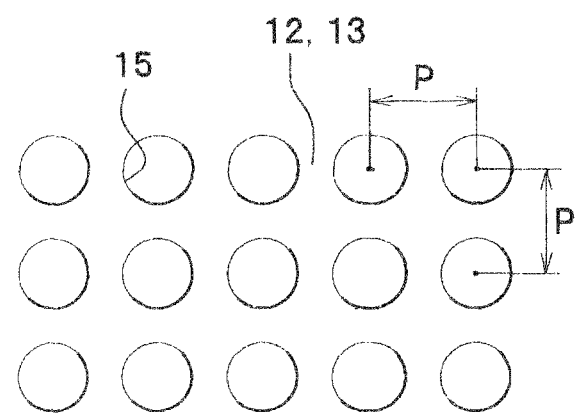
FIG. 2A is a diagram showing one example of a light emission surface as seen in a plan view.
Figure 2B:
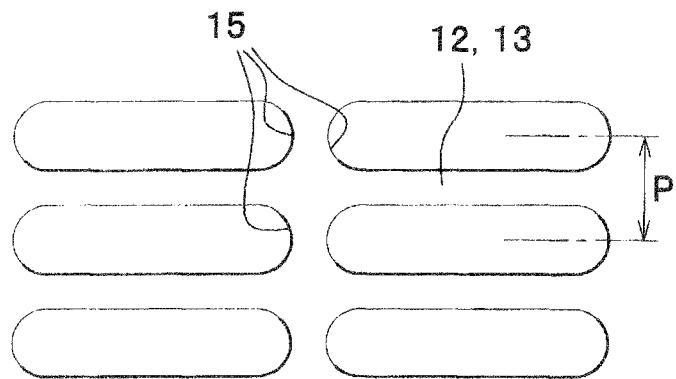
FIG. 2B is a diagram showing another example of a light emission surface as seen in a plan view.

As seen in FIG. 2A, the recessed portions 15 may form a dotted pattern with each of the dots being arranged in a grid pattern. Further, as seen in FIG. 2B, the recessed portions 15 may consist of a plurality of interspaced grooves. Although not shown in the drawings, the recessed portions may consist of a plurality of continuous grooves.

The pitch P of two adjacent recessed portions 15 is in the range of 0.01-100 times the center wavelength $\lambda c$ of light emitted from the LED element 10 which is the light emitting element.

The pitch P of the recessed portions 15 is preferably in the range of 0.05-20 times the center wavelength $\lambda c$, more preferably in the range of 0.1-5 times the center wavelength $\lambda c$, and most preferably in the range of 0.2-2 times the center wavelength $\lambda c$. To be more specific, the lower limit value of the pitch P is preferably equal to or greater than 0.01 times the center wavelength $\lambda c$, more preferably equal to or greater than 0.05 times the center wavelength $\lambda c$, and further more preferably equal to or greater than 0.1 times the center wavelength $\lambda c$, and most preferably equal to or greater than 0.2 times the center wavelength $\lambda c$. Further, the upper limit value of the pitch P is preferably equal to or smaller than 100 times the center wavelength $\lambda c$, more preferably equal to or smaller than 20 times the center wavelength $\lambda c$, and further more preferably equal to or smaller than 5 times the center wavelength $\lambda c$, and most preferably equal to or smaller than 2 times the center wavelength $\lambda c$.

The recessed portion 15 has a diameter or a width of the groove in the range of 0.005-25 times the center wavelength $\lambda c$, preferably in the range of 0.025-10 times the center wavelength $\lambda c$, more preferably in the range of 0.05-2.5 times the center wavelength $\lambda c$, and most preferably in the range of 0.25-2 times the center wavelength $\lambda c$.

Herein, the diameter of the recessed portion 15 or the width of the groove of the recessed portion 15 indicates the size of the recessed portion 15 at a half of the depth thereof, which is a so-called half-value width.

The diameter of the recessed portion 15 or the width of the groove of the recessed portion 15 may appropriately be set in the above range. However, the diameter or the width is preferably adjusted in accordance with the size of the pitch P so that the refractive index becomes macroscopically gradually smaller as it is away from the light emission surface 18. In other words, it is preferable that if the pitch P is greater, the recessed portion 15 has a larger diameter or a larger width of the groove, and that if the pitch P is smaller, the recessed portion 15 has a smaller diameter or a smaller width of the groove. In this point of view, it is preferable that the diameter or the width of the groove is sized to be approximately a half of the pitch P. For example, the diameter or the width of the groove is preferably in the range of 20-80% of the pitch P, more preferably in the range of 30-70% of the pitch P, and most preferable in the range of 40-60% of the pitch P.

The depth of the recessed portion 15 is preferably in the range of 0.01-20 times the center wavelength $\lambda c$, more preferably in the range of 0.05-10 times the center wavelength $\lambda c$, further more preferably in the range of 0.1-5 times the center wavelength $\lambda c$, and most preferably in the range of 0.2-2 times the center wavelength $\lambda c$.

The method of manufacturing the LED package 1 configured as above will be described below.

Figure 4A:
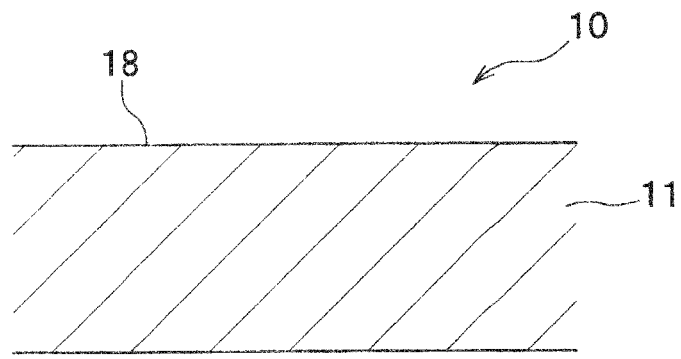
FIG. 4A is a diagram showing a sequence of the manufacturing process for the LED package.

As best seen in FIG. 4A, a light emitting portion 11 which is a main body of the LED element 10 is prepared. The light emitting portion 11 is manufactured by any conventional manufacturing method.

Figure 4B:
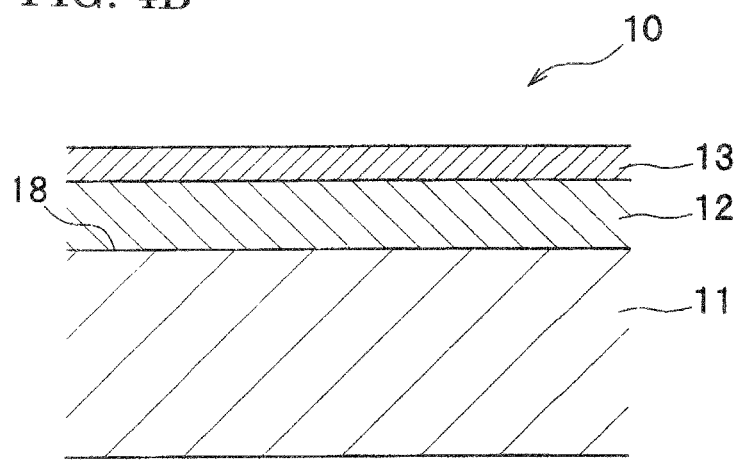
FIG. 4B is a diagram showing a sequence of the manufacturing process for the LED package.

As seen in FIG. 4B, a recording material layer 12 and a barrier layer 13 are formed in this order.

Figure 3A:
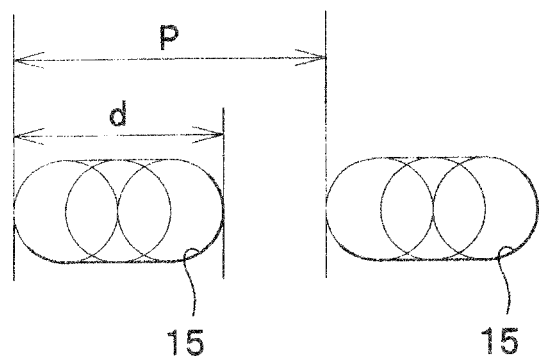
FIG. 3A is a diagram explaining a relation between diameter and pitch of a recessed portion.
Figure 3B:
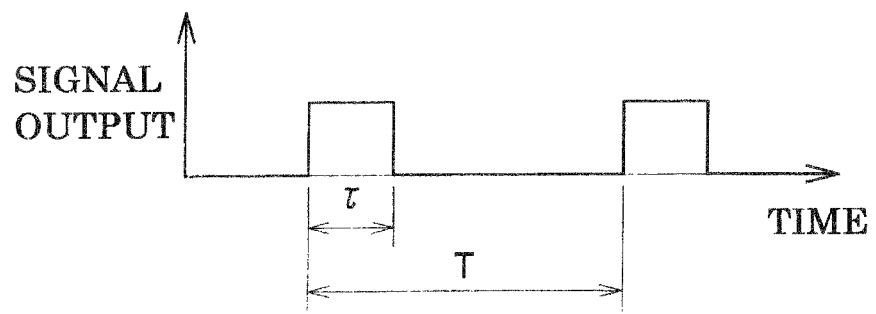
FIG. 3B is a diagram explaining a relation between light-emitting time and period of a laser beam.

Next, a plurality of recessed portions 15 are formed. An apparatus for forming recessed portions 15 may have the same construction with a conventionally known optical disc drive such as disclosed in Japanese Laid-open Patent Publication No. 2003-203348. With this optical disc drive, a silicon wafer in which an LED element 10 is formed in a matrix pattern is formed in the same shape as the optical disc or it is attached to a dummy optical disc, so that the silicon wafer is set on the disc drive. The recording material layer 12 is then illuminated with a laser beam whose output is adjusted to an appropriate output in accordance with the material of the recording material layer 12 so that a plurality of recessed portions 15 can be formed. Further, pulse signals or continuous signals are input to the laser source such that the illumination pattern of the laser beam conforms with the dotted pattern of FIG. 2A or the grooved pattern of FIG. 2B. As seen in FIG. 3B, the duty cycle of the laser beam emitted in a predetermined period T, which is defined by τ/T where τ indicates emission time and T indicates period, is preferably set smaller than the duty cycle of the actually formed recessed portions 15 (i.e., length d of a recessed portion 15 in the laser beam scanning direction versus pitch P; see FIG. 3A). It is noted that an oblong-shaped recessed portion 15 can be formed by moving the circle-shaped laser beam shown in FIG. 3A at a predetermined speed during the emission time τ. For example, assuming that the length d of the recessed portion 15 is 50 while the pitch P of the recessed portion 15 is 100, it is preferable that laser beam is emitted at a duty cycle less than 50%. In this instance, the upper limit value of the duty cycle of the laser beam is preferably less than 50%, more preferably less than 40%, and most preferably less than 35%. Meanwhile, the lower limit value of the duty cycle is preferably equal to or higher than 1%, more preferably equal to or higher than 5%, and most preferably equal to or higher than 10%. It is possible to accurately form the recessed portion 15 having a predetermined pitch by setting the duty cycle as described above.

Further, a known focusing method used in the optical disc drive may be also adapted. For example, by the use of an astigmatic method, the laser beam can be readily focused on the surface of the light emission surface 18 irrespective of a warpage or bent of the light emitting portion 11.

Figure 4C:
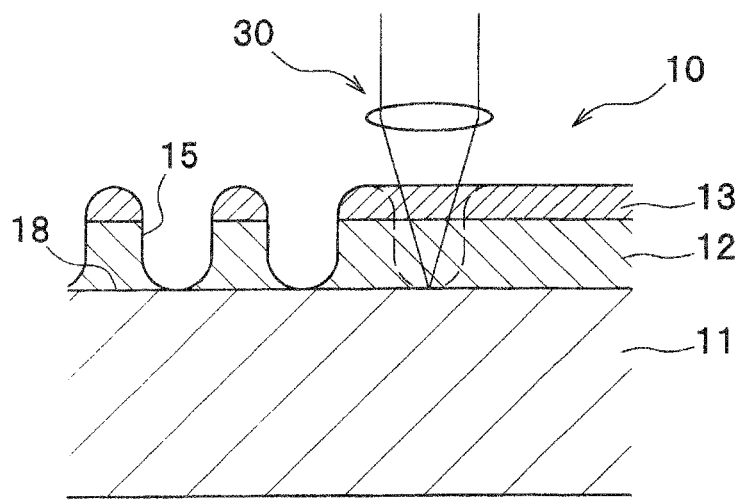
FIG. 4C is a diagram showing a sequence of the manufacturing process for the LED package.

Accordingly, as best seen in FIG. 4C, the LED element 10 is illuminated with the laser beam from the light emission surface 18 side while the laser beam is condensed using an optical system 30 of the disc drive. As with the case where information is recorded in the optical recording disc, the light emitting portion 11 is rotated during which the optical system 30 is moved in the radial direction of the light emitting portion 11, so that a plurality of recessed portions 15 are formed entirely in the light emission surface 18.

The recessed portions 15 are formed in accordance with the following processing conditions.

Numerical aperture NA of the optical system 30 may be set such that the lower limit thereof is preferably 0.4 or more, more preferably 0.5 or more, and most preferably 0.6 or more. Meanwhile, the upper limit of the numerical aperture NA is preferably 2 or less, more preferably 1 or less, and most preferably 0.9 or less. If the numerical aperture NA is too small, a fine processing cannot be performed. If the numerical aperture NA is too large, a margin is decreased with respect to an angle at a time of recording.

The wavelength of the optical system 30 may be set, for example, to 405±30 nm, 532±30 nm, 650±30 nm, and 780±30 nm. These wavelengths are preferable to obtain a higher output.

The shorter the wavelength, the finer the processing is available. Therefore, a short wavelength is preferable.

The lower limit of the output of the optical system 30 is 0.1 mW or more, preferably 1 mW or more, further more preferably 5 mW or more, and most preferably 20 mW or more. The upper limit of the output of the optical system 30 is 1000 mW or less, preferably 500 mW or less, and most preferably 200 mW or less. If the output of the optical system 30 is too low, processing of the recessed portions 15 requires considerable time. On the contrary, if the output of the optical system 30 is too high, the durability of parts constituting the optical system 30 becomes deteriorated.

The linear velocity for relatively moving the optical system 30 with respect to the recording material layer 12 is set such that the lower limit of the linear velocity is 0.1 m/s or higher, preferably 1 m/s or higher, more preferably 5 m/s or higher, and most preferably 20 m/s or higher, whereas the upper limit of the linear velocity is 500 m/s or lower, preferably 200 m/s or lower, more preferably 100 m/s or lower, and most preferably 50 m/s or lower. If the linear velocity is too high, it becomes difficult to execute processing with increased accuracy. On the contrary, if the linear velocity is too low, processing requires considerable time and the recessed portions 15 cannot be formed accurately.

As an optical processing apparatus including the optical system 30, NE0500 manufactured by Pulstec Industrial Co., Ltd. can be used.

Further, although not shown in the drawings, the LED element 10 is fixed on the case 20 and necessary wiring is provided, so as to manufacture the LED package 1.

According to the LED package 1 configured as above, the refractive index macroscopically and gradually changes in the vicinity of the light emission surface 18 because of the fine asperities formed in the light emission surface 18. Therefore, it is possible to restrict light emitted from the light emission surface 18 from being reflected by the inner surface of the light emission surface 18. This can improve the luminous efficiency of the LED package 1.

As described above, the recording material layer 12 can be formed at once in large quantity by means of coating, etc, and the recessed portions 15 can be formed quickly and cheaply using an apparatus which is similar in structure to the conventionally known optical disc drive. Further, a known focusing method can be adapted so that the recessed portions 15 can be formed in a simple manner irrespective of a warpage of the material. This manufacturing process is very simple when compared with a conventional complicated method including application of the material, baking, exposure, baking, and etching. Therefore, it is possible to simply form fine asperities in the light emission surface of the light emitting element so as to improve the luminous efficiency.

Second Embodiment

An optical element and a manufacturing method for the optical element according to a second embodiment of the present invention will be described. In the drawings to be referred to, an optical element according to the second embodiment is shown in FIG. 5.

An optical element 10A is a member with a high transmissivity for light, and is closely-attached or adhered to the light emission surface of the light emitting element. For example, the optical element 10A is attached to the surface of the light emission surface 18 of the LED package 1 which has been exemplified in the first embodiment or to the surface of a fluorescent tube.

Figure 5:
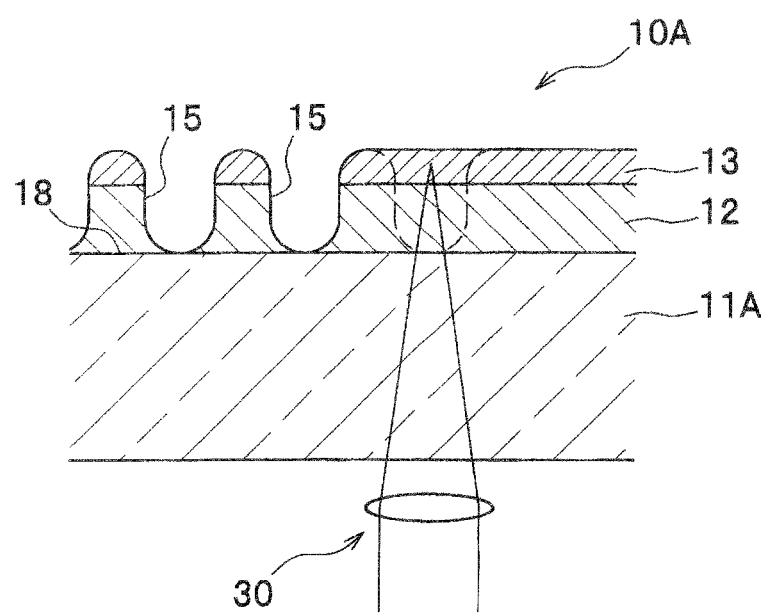
FIG. 5 is a diagram showing an optical element according to the second embodiment.

As seen in FIG. 5, the optical element 10A is configured such that a recording material layer 12 and a barrier layer 13 which are similar to those described in the first embodiment are formed on a transparent supporting member 11A and a plurality of recessed portions 15 are formed.

The supporting member 11A may have a sufficient transmissivity (e.g., transmissivity of approximately 80% or more) with respect to light emitted from the light emitting element. The supporting member 11A is made of resin such as polycarbonate or a glass material.

In order to form the recessed portions 15, the supporting member 11A is moved during which a laser beam is condensed as with the case of the first embodiment so that the supporting member 11A is illuminated with a pulsed laser beam. In this instance, as best seen in FIG. 5, the optical element 10A may be illuminated with the laser beam from the supporting member 11A side (opposite side of the recording material layer 12). In the case where the laser beam is emitted from the opposite side of the recording material layer 12, the laser beam source is advantageously free from being soiled by clinker that is spewed out from the recording material layer 12 upon reaction with the laser beam.

The optical element 10A configured as above is attached to the surface of the light emission surface 18 of the LED package 1 or to the surface of the fluorescent tube, so that the luminous efficiency of these light emitting elements can be improved.

Third Embodiment

A method of manufacturing a light emitting element according to a third embodiment of the present invention will be described. In the drawings to be referred to, FIGS. 6A-6C are diagrams showing a sequence of the manufacturing process for an LED element according to the third embodiment.

Figure 6A:
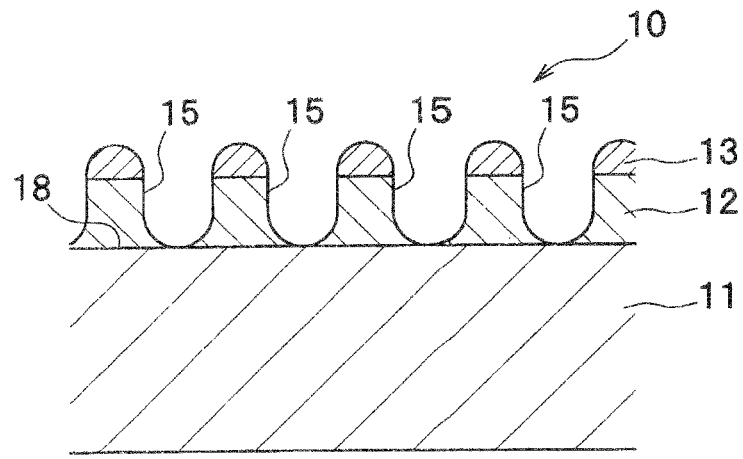
FIG. 6A is a diagram showing a step of the manufacturing process for an LED element according to the third embodiment.
Figure 6B:
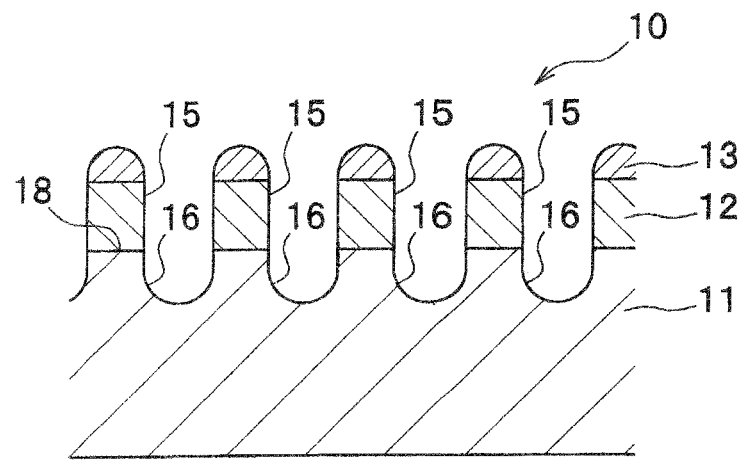
FIG. 6B is a diagram showing a step of the manufacturing process for an LED element according to the third embodiment.
Figure 6C:
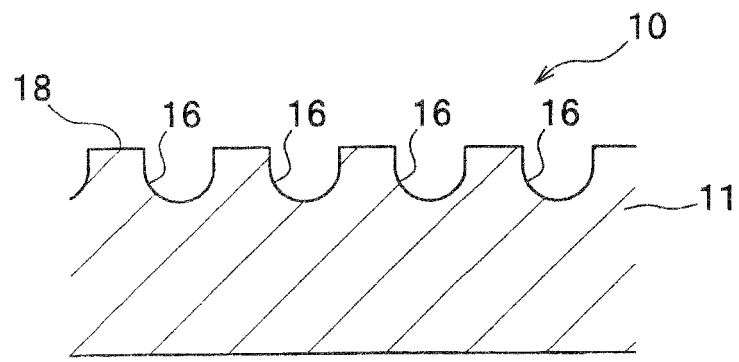
FIG. 6C is a diagram showing a step of the manufacturing process for an LED element according to the third embodiment.

In the manufacturing method for the LED element 10 according to the this embodiment, a plurality of recessed portions 15 are formed in the recording material layer 12 and the barrier layer 13 as seen in FIG. 6A by the same processing method as described in the first embodiment (see FIGS. 4A-4C). Thereafter, etching is performed while the recording material layer 12 and the barrier layer 13 in which a plurality of recessed portions 15 are formed are used as a mask, so that a plurality of holes 16 corresponding to the recessed portions 15 are formed in the light emission surface 18 as shown in FIG. 6B. Finally, as best seen in FIG. 6C, the recording material layer 12 and the barrier layer 13 are removed using a predetermined stripping agent, so that the light emission surface 18 with a fine asperity pattern is exposed to view.

Various etching methods can be adapted, such as wet etching and dry etching. However, reactive ion etching (RIE) is referable because an etching gas tends to travel in a straight line so that tine patterning can be performed. Further, removal of the recording material layer 12 and the barrier layer 13 may be carried out by various methods including a dry process and a wet process.

As a specific example for the etching method and the removal method, for example, in the case where a layer including the light emission surface 18 of the light emitting portion 11 is made of glass, the recording material layer 12 contains dye, and the barrier layer 13 is made of an inorganic material layer, it is preferable that RIE using SF6 as an etching gas is adapted and a wet removal process using ethanol as a stripping agent is adapted. Herein, the term "layer including the light emission surface" indicates any layer as long as it forms a surface boundary with respect to the external environment such as gas (e.g. air) and liquid (e.g. water) after manufacture of the LED element 10.

According to the manufacturing method in this third embodiment, since asperities are formed in the surface (light emission surface 18) itself of the LED element 10, it is possible to simply design the asperity pattern without consideration of the refractive index difference between the LED element 10 and the recording material layer 12. According to this embodiment, a plurality of recessed portions 15 are formed in the recording material layer 12, which has been formed in advance on the surface of the LED element 10, using, for example, the focusing technique, so that a mask is reliably set in close contact with the surface of the LED element 10. Therefore, the manufacturing method according to this embodiment is free from a drawback of the conventional manufacturing method that a mask does not closely contact with the surface of the LED element 10 because of warpage or bent of the surface of the LED element 10. Therefore, the asperity pattern can be formed in a simple manner.

Although the present invention has been described with reference to the above specific embodiments, the present invention is not limited to these specific embodiments and various changes and modifications may be made without departing from the scope of the attached claims. For example, in the above embodiments, the LED element is shown as an example of the light emitting element. However, the light emitting element is not limited to the LED element and may be any light emitting device such as a plasma display element, a laser, an SED element, a fluorescent tube, and an EL element.

In the above embodiments, the recording material layer 12 is directly provided on the light emission surface of the light emitting element. However, another material may be interposed between the light emission surface and the recording material layer 12. In the case where a protective layer or/and a lens is provided on the surface of the LED element consisting of a semiconductor, the surface (surface boundary to air) of the protective layer or the lens becomes a light emission surface. In this instance, the recording material layer 12 and the recessed portions 15 are provided on the surface of the protective layer or the surface of the lens. In the above embodiments, the recessed portions 15 are formed using a laser beam. However, as long as light can be condensed to a required size, another kind of light other than a monochromatic light such as a laser beam may be used.

In order to obtain the minimum processing shape of the recessed portion 15, the laser beam is emitted at infinitesimally small time intervals. The diameter of the processed recessed portion 15 is preferably smaller than the wavelength of the laser beam. In other words, it is preferable that the laser beam is condensed to have a smaller spot diameter which satisfies the above relation.

In the case where a large recessed portion is required which is greater than the minimum processing shape of the recessed portion 15 (hereinafter referred to as a "laser spot"), a plurality of laser spots can be connected to provide a large recessed portion 15. It is noted that when the heat mode-type recording material layer 12 is illuminated with the laser beam, a change of the recording material layer 12 occurs on a part of the exposed area after the temperature of the illuminated area reaches the transition temperature. Because the light intensity is greatest at the center region of the laser beam and is gradually attenuated toward the edge of the laser beam, a fine hole (laser spot) having a diameter smaller than the spot diameter of the laser beam can be created in the recording material layer 12. In the case where an oblong recessed portion 15 is formed by continuously connecting fine holes, the profile accuracy of the recessed portion 15 can be improved. If the recording material layer 12 is made of a photon mode-type material, a reaction occurs on the whole exposed area where the laser beam strikes the surface thereof. Therefore, the size of the hole (i.e., laser spot) formed by a single laser illumination becomes relatively large, and the profile accuracy thereof deteriorates compared with the recording material layer made of the heat mode-type material. The heat mode-type material such as used in the present invention is therefore preferable.

In the above preferred embodiments, the barrier layer 13 is formed on the recording material layer 12. However, the present invention is not limited to this specific configuration, and the barrier layer 13 may be omitted. Especially, when the recording material layer 12 is used as a etching mask according to the third embodiment, it is preferable that the barrier layer 13 is not provided.

According to the third embodiment as described above, a plurality of holes 16 are formed in the surface of the LED element 10. However, the present invention is not limited to this specific configuration, and a plurality of holes may be formed in the surface of the optical element 10A (surface of the supporting member 11A) as described in the second embodiment by employing the recording material layer 12, etc. as a etching mask.

Figure 7A:
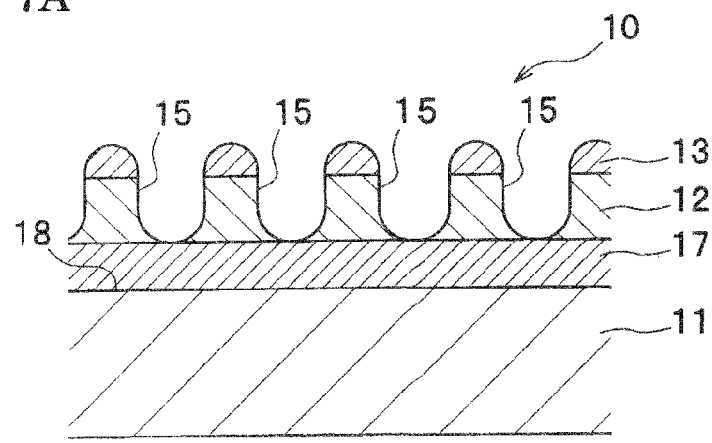
FIG. 7A is a diagram showing a modification of the manufacturing process for the LED element according to the third embodiment.

Further, according to the third embodiment as described above, the recording material layer 12, etc. is directly provided as an etching mask on the light emission surface 18, in which holes 16 are formed. However, the present invention is not limited to this specific configuration. For example, if the recording material layer 12, etc. is apt to be etched by the etching gas for etching a layer including the light emission surface 18, a mask layer 17 may be provided between the light emission surface 18 and the recording material layer 12 as best seen in FIG. 7A. The mask layer 17 can be etched by an etching gas which has little influence on the recording material layer 12, etc.

Figure 7B:
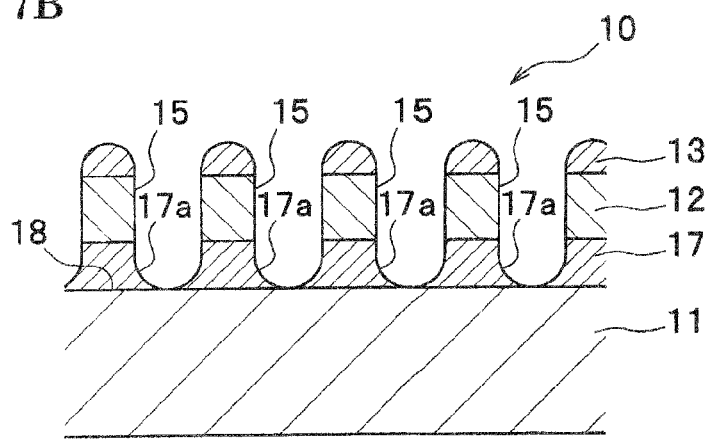
FIG. 7B is a diagram showing a modification of the manufacturing process for the LED element according to the third embodiment.

According to this example, a plurality of recessed portions 15 are formed in the recording material layer 12 and the barrier layer 13 using a laser beam (see FIG. 7A) as with the first embodiment. Next, as seen in FIG. 7B, the mask layer 17 is etched by a first etching gas, so that a plurality of through-holes 17a corresponding to the recessed portions 15 are formed in the mask layer 17. Since the first etching gas is a gas selected from the group consisting of any kind of gases which do not etch or remove the recording material layer 12 and the barrier layer 13, the mask layer 17 can be etched while the recording layer 12 and the barrier layer 13 function as a mask.

Figure 7C:
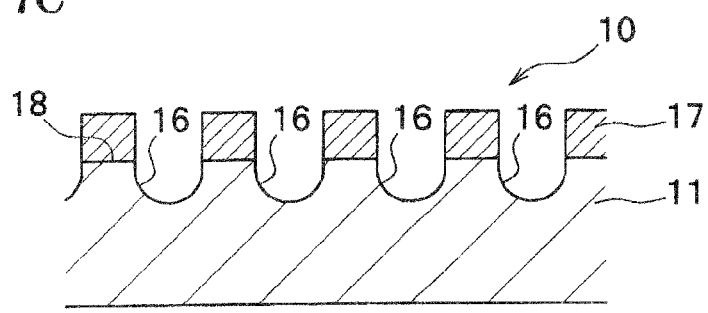
FIG. 7C is a diagram showing a modification of the manufacturing process for the LED element according to the third embodiment.
Figure 7D:
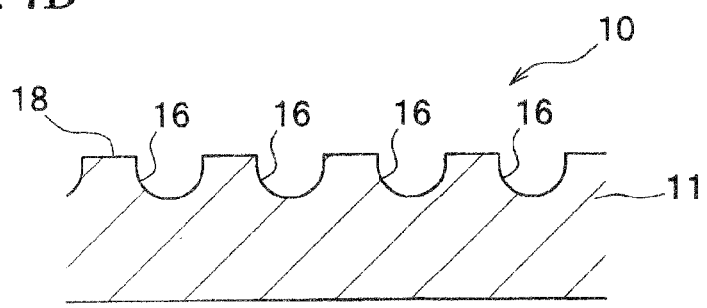
FIG. 7D is a diagram showing a modification of the manufacturing process for the LED element according to the third embodiment.

Thereafter, as best seen in FIG. 7C, the layer including the light emission surface 18 is etched by a second etching gas, so that a plurality of holes 16 corresponding to the recessed portions 15 are formed in the light emission surface 18. During this process, the recording material layer 12 and the barrier layer 13 are etched by the second etching gas, and they are removed promptly. However, the light emission surface 18 can be etched successfully and excellently because the mask layer 17 functions as a mask. Thereafter, as seen in FIG. 7D, the mask layer 17 is removed by a predetermined stripping agent, so that the light emission surface 18 having an asperity pattern is exposed to view.

As a specific example of the configuration as shown in FIGS. 7A-7D, for example, in the case where the layer including the light emission surface 18 of the light emitting portion 11 is made of sapphire, the recording material layer 12 contains dye, and the barrier layer 13 is made of an inorganic material layer, it is preferable that a Si-containing Bi-Layer photoresist manufactured by TOKYO OHKA KOGYO CO., LTD. is employed as the mask layer 17, SF6 is used as the first etching gas, and $Cl_2$ is used as the second etching gas.

EXAMPLES

In order to prove advantageous effects of the present invention, some examples will be described below.

In one example, an optical element similar to that of the second embodiment was manufactured. The optical element was manufactured such that a dye-containing layer (recording material layer) having a thickness of 100 nm was formed on a flat surface of a disc-shaped polycarbonate substrate (supporting member), followed by illumination of the dye-containing layer with a laser beam to form a plurality of recessed portions in a one square millimeter region at a pitch of 0.5 μm.

Details of each layer were as follows.

| Substrate | |
|---|---|
| Material: | Polycarbonate |
| Thickness: | 0.6 mm |
| Outer diameter: | 120 mm |
| Inner diameter: | 15 mm |
| Dye-containing layer (Recording material layer) | |

2 g of the dye-containing material given by the following formula was dissolved in 100 ml of TFP (tetrafluoropropanol) solvent, and the resulting solution was spin coated at an application-start rotation speed of 500 rpm and at an application-finish rotation speed of 1000 rpm. During the spin coating, the application liquid was dispensed on the inner peripheral portion of the substrate, and the rotation speed was gradually increased to 2200 rpm.

The refractive index n of the dye-containing material was 1.986 and the extinction coefficient k of the dye material was 0.0418.

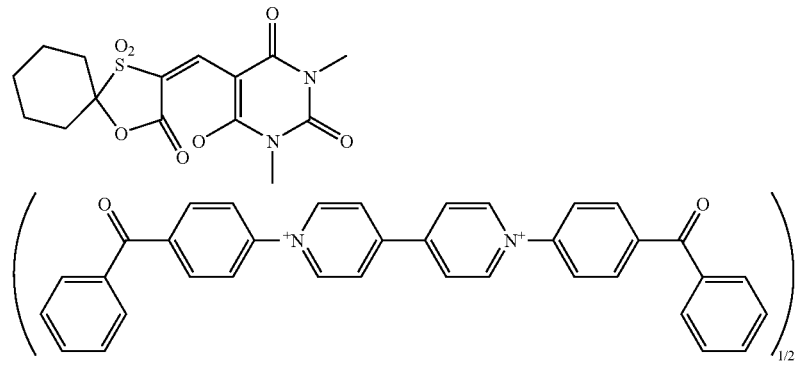

Barrier Layer

A thin film of $ZnO$—$Ga_2O_3$ (ZnO: 95 weight percent, $Ga_2O_3$: 5 weight percent) was formed by DC magnetron sputtering.

| Thickness: | approximately 5 nm |
|---|---|
| Output: | 1 kW |
| Film-formation time: | 2 seconds |
| Atmosphere: | Ar (flow rate of 50 sccm) |

In the above optical recording medium, fine recessed portions were formed from the barrier layer side using NE0500 (wavelength: 405 nm, NA: 0.65) manufactured by Pulstec Industrial Co., Ltd. The recessed portions were arranged in a pattern of FIG. 2A, and the arrangement pitch was 1 μm. Conditions for forming the recessed portions were as follows.

| | |
|---|---|
| Laser output: | 2 mW |
| Linear velocity: | 5 m/s |
| Recording signal: | Square wave of 5 $MH_z$ |

The optical element manufactured accordingly was cut and then adhered to a green light emitting diode using clear adhesive.

Example 2

The same operations as those described in EXAMPLE 1 were repeated, except that the optical element did not have a barrier layer.

As a comparative example, a sample was prepared, in which an optical element according to the present invention was not adhered to a green light emitting diode. Brightness of the sample was measured using an optical power meter.

As a result, assuming that the output (brightness) of the LED according to this comparative example was 1, the output (brightness) of each of the LEDs according to EXAMPLES 1 and 2 was 1.2. Therefore, it was proved that use of the optical element according to the present invention contributes to a simple improvement in the light transmitting efficiency and to an improvement in the efficiency of the light emitting element.

Example 3

The same operations as those described in EXAMPLE 1 were repeated, except that the substrate was made of silicon and the recessed portions were formed at a pitch of 0.5 μm. As with EXAMPLE 1, a plurality of recessed portions were formed in the recording material layer and the barrier layer, and thereafter, asperities were formed on the silicon substrate by dry etching. The conditions of the dry etching were as follows.

| | |
|---|---|
| Etching gas: | $SF_6$ + $CHF_3$ (1:1) |
| Depth of recessed portion: | 50 nm |
| Stripping agent for stripping the recording material layer, etc.: | ethanol |

The optical element manufactured accordingly was cut and then adhered to a green LED using clear adhesive. As a comparative example, a sample was prepared, in which an optical element according to the present invention was not adhered to a green LED. Brightness of the sample was measured using the optical power meter.

As a result, assuming that the output (brightness) of the LED according to this comparative example was 1, the output (brightness) of the LED according to EXAMPLE 3 was 1.3. Therefore, it was proved that use of the optical element according to the present invention contributes to a simple improvement in the light transmitting efficiency and to an improvement in the efficiency of the light emitting element.

What is claimed is:

1. A light emitting element, comprising:
a luminous body; and
a thermally deformable heat mode recording material layer provided over a light emission surface of the luminous body;
wherein a plurality of recessed portions are formed in the recording material layer at a pitch of 0.01-100 times a center wavelength of light emitted from the luminous body, and the emitted light is non-reflected light, and
wherein the thermally deformable heat mode recording material layer undergoes change of shape when it is illuminated with light and absorbs heat converted from the illuminated light.

2. A light emitting element according to claim 1, wherein the recording material layer contains an organic dye as a thermally deformable heat mode recording material.

3. A light emitting element according to claim 2, wherein the recording material layer has an extinction coefficient in the range of 0.0001 to 10 with respect to the illuminated light.

4. A light emitting element according to claim 1, wherein the recording material layer includes a recording material selected from the group consisting of cyanine-based, phthalocyanine-based, quinone-based, squarylium-based, azlenium-based, thiol complex salt-based, and melocyanine-based recording materials.

5. A method of manufacturing a light emitting element with a luminous body comprising the steps of:
forming a thermally deformable heat mode recording material layer over a light emission surface; and
illuminating the recording material layer with converged light to form a plurality of recessed portions in the recording material layer at a pitch of 0.01-100 times a center wavelength of light emitted from the luminous body,
wherein the thermally deformable heat mode recording material layer undergoes change of shape when it is illuminated with light and absorbs heat converted from the illuminated light.

6. A method of manufacturing a light emitting element according to claim 5, further comprising a step of forming a plurality of holes corresponding to the recessed portions in the light emission surface by etching using the recording material layer as a mask.

7. A method of manufacturing a light emitting element according to claim 5, wherein the recording material layer contains an organic dye as a thermally deformable heat mode recording material.

8. A method of manufacturing a light emitting element according to claim 7, wherein the recording material layer has an extinction coefficient in the range of 0.0001 to 10 with respect to the illuminated light.

9. A method of manufacturing a light emitting element according to claim 5, wherein the recording material layer includes a recording material selected from the group consisting of cyanine-based, phthalocyanine-based, quinone-based, squarylium-based, azlenium-based, thiol complex salt-based, and melocyanine-based recording materials.

10. An optical element to be mounted over a light emission surface of a light emitting element so as to improve a luminous efficiency of the light emitting element, the optical element comprising:
a supporting member which allows light emitted from the light emitting element to transmit therethrough; and
a thermally deformable heat mode recording material layer provided over a surface of the supporting member, wherein a plurality of recessed portions are formed in the recording material layer at a pitch of 0.01-100 times a center wavelength of light emitted from the light emitting element, and wherein the thermally deformable heat mode recording material layer undergoes change of shape when it is illuminated with light and absorbs heat converted from the illuminated light.

11. An optical element according to claim 10, wherein the recording material layer contains an organic dye as a thermally deformable heat mode recording material.

12. An optical element according to claim 11, wherein the recording material layer has an extinction coefficient in the range of 0.0001 to 10 with respect to the illuminated light.

13. An optical element according to claim 10, wherein the recording material layer includes a recording material selected from the group consisting of cyanine-based, phthalocyanine-based, quinone-based, squarylium-based, azlenium-based, thiol complex salt-based, and melocyanine-based recording materials.

14. A method of manufacturing an optical element which is to be mounted over a light emission surface of a light emitting element so as to improve a luminous efficiency of the light emitting element, the method comprising the steps of:

forming a thermally deformable heat mode recording material layer over a surface of a supporting member which allows light emitted from the light emitting element to transmit therethrough; and illuminating the recording material layer with converged light to form a plurality of recessed portions in the recording material layer at a pitch of 0.01-100 times a center wavelength of light emitted from the light emitting element, wherein the thermally deformable heat mode recording material layer undergoes change of shape when it is illuminated with light and absorbs heat converted from the illuminated light.

15. A method of manufacturing an optical element according to claim 14, further comprising a step of forming a plurality of holes corresponding to the recessed portions in a surface of the supporting member by etching using the recording material layer as a mask.

16. A method of manufacturing an optical element according to claim 14, wherein the recording material layer contains an organic dye as a thermally deformable heat mode recording material.

17. A method of manufacturing an optical element according to claim 16, wherein the recording material layer has an extinction coefficient in the range of 0.0001 to 10 with respect to the illuminated light.

18. A method of manufacturing an optical element according to claim 14, wherein the recording material layer includes a recording material selected from the group consisting of cyanine-based, phthalocyanine-based, quinone-based, squarylium-based, azlenium-based, thiol complex salt-based, and melocyanine-based recording materials.

* * * * *

UNITED STATES PATENT AND TRADEMARK OFFICE
CERTIFICATE OF CORRECTION

PATENT NO.       : 8,710,524 B2  
APPLICATION NO.  : 12/529984  
DATED            : April 29, 2014  
INVENTOR(S)      : Usami et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 32 days.

Signed and Sealed this

Twenty-ninth Day of September, 2015

Michelle K. Lee  
*Director of the United States Patent and Trademark Office*